United States Patent [19]

Meador et al.

[11] 4,198,470

[45] Apr. 15, 1980

[54] BASE PLATE AND LITHOGRAPHIC PLATE PREPARED BY SENSITIZATION THEREOF

[75] Inventors: Jim D. Meador, Bridgeton; Edward H. Parker, Ballwin, both of Mo.

[73] Assignee: Western Litho Plate & Supply Co., St. Louis, Mo.

[21] Appl. No.: 884,177

[22] Filed: Mar. 7, 1978

Related U.S. Application Data

[60] Division of Ser. No. 834,238, Sep. 19, 1977, which is a continuation of Ser. No. 584,880, Jun. 9, 1975, abandoned.

[51] Int. Cl.[2] .......................... G03F 7/02; G03C 1/94; G03C 1/52

[52] U.S. Cl. .................................... 428/457; 428/908; 430/155; 430/276; 430/285; 430/302; 430/525

[58] Field of Search ........................... 96/75, 86 P, 33; 428/457, 469, 908

[56] References Cited

U.S. PATENT DOCUMENTS

| | | | |
|---|---|---|---|
| 2,726,956 | 12/1955 | Jahoda | 96/75 |
| 2,871,119 | 1/1959 | Weegar et al. | 96/49 |
| 2,937,085 | 5/1960 | Seven et al. | 96/33 |
| 3,010,389 | 11/1961 | Buskes | 101/149.2 |
| 3,010,390 | 11/1961 | Buskes | 101/149.2 |
| 3,010,391 | 11/1961 | Buskes et al. | 101/149.2 |
| 3,111,407 | 11/1963 | Lindquist et al. | 96/75 X |
| 3,128,181 | 4/1964 | Doggett | 96/33 |
| 3,272,629 | 9/1966 | Hills | 96/75 |
| 3,298,852 | 1/1967 | Beatty et al | 96/75 |
| 3,382,069 | 5/1968 | Barchers et al. | 96/33 |
| 3,396,019 | 8/1968 | Uhlig | 96/33 |
| 3,606,922 | 9/1971 | Doggett | 156/329 |
| 3,632,375 | 1/1972 | Gipe | 96/75 X |
| 3,660,097 | 5/1972 | Mainthia | 96/91 |
| 3,728,123 | 4/1973 | Gipe | 96/75 |
| 3,733,200 | 5/1973 | Takaishi et al. | 96/86 R |
| 3,751,257 | 8/1973 | Dahlman | 96/91 R |
| 3,765,894 | 10/1973 | Mellan | 96/86 |
| 3,790,385 | 2/1974 | Steppan et al. | 96/75 |
| 3,836,366 | 9/1974 | Silver | 96/33 |
| 3,958,994 | 5/1976 | Burnett | 96/75 |
| 3,976,487 | 8/1976 | Kubotera et al. | 96/33 |
| 3,996,056 | 12/1976 | Muller | 96/75 |

FOREIGN PATENT DOCUMENTS 761493 11/1956 United Kingdom .

*Primary Examiner*—Harold Ansher

*Attorney, Agent, or Firm*—Senniger, Powers, Leavitt & Roedel

[57] ABSTRACT

A base plate adapted to be coated with a light-sensitive diazo resin, and a lithographic plate which may be prepared therefrom. The base plate includes a substrate comprising a metal support and having a water-wettable, hydrophilic surface. Over the substrate and in direct contact with the surface is a layer comprising an oleophilic ink-receptive organic resin adapted to receive a light-sensitive coating comprising a diazo resin sensitizer. The oleophilic resin layer is permeable to the sensitizer so that it may penetrate substantially through the resin layer to establish sufficient contiguity between the diazo resin and the substrate so that both the light-sensitive coating and the organic resin layer become anchored to the substrate in the areas of exposure when the light-sensitive coating is exposed to light. Methods of preparing the base plate and lighographic plate are also disclosed.

9 Claims, 2 Drawing Figures

BASE PLATE AND LITHOGRAPHIC PLATE PREPARED BY SENSITIZATION THEREOF

CROSS REFERENCE TO RELATED APPLICATION

This is a division of our prior application Ser. No. 834,238, filed Sept. 19, 1977, which in turn is a continuation of our application Ser. No. 584,880, filed June 9, 1975, now abandoned.

BACKGROUND OF THE INVENTION

This invention relates to the field of lithography and, more particularly, to an improved base plate adapted for use in the preparation of either presensitized or wipe-on substractive lithographic plates, to an improved sensitized plate which may be prepared from the base plate, and to methods for preparing such plates.

Among the most desirable and widely used light sensitizers for negative-acting lithographic plates are the various diazo resins, in particular those prepared by condensation of a 4-diazo-1,1'-diphenylamine with formaldehyde or other carbonyl compounds. Coated on an appropriate hydrophilic support, such as aluminum, these diazo resins may be exposed and developed to provide sharp ink-receptive serviceable images for lithographic printing.

Diazo resins are conventionally prepared by condensation in an acid medium such as sulfuric or phosphoric acid. The resin is typically precipitated as a double salt, for example with zinc chloride. Depending upon the medium in which the condensation reaction is carried out, the diazo resin may be either organic solvent-soluble or water-soluble. Because of the expense, hazard and pollution problems associated with organic solvents, water-soluble diazo resins are often preferable from a processing standpoint, especially in wipe-on operations and in relatively low volume printing operations where the inconvenience and expense of handling and recovering organic solvents may be a serious burden.

Because diazo resin images tend to be rather fragile, diazo-sensitized lithographic plates are generally not well adapted for strictly subtractive development, nor is the press life exhibited by such plates typically very high. In order to provide an image of the toughness and oleophilicity required for longer run printing, so-called "add-on" developers are commonly used in the preparation of an exposed diazo-sensitized lithographic plate for printing. Add-on developers contain an organic resin component such as an epoxy which forms a durable oleophilic add-on coating over the diazo image. Add-on developers are effective in the preparation of plates for printing but their application requires care and expertise if satisfactory results are to be realized.

On the basis of durability, hydrophilicity and cost, aluminum is the preferred support for lithographic plates. Since diazo resins are reactive with and deteriorate on a bare aluminum surface, however, aluminum was initially considered suitable only as a substrate for freshly prepared diazo-sensitized plates. Subsequently, numerous barrier layers, for example, sodium silicate, have been utilized to allow the use of aluminum as a support for diazo resin plates which may be stored. Barrier layers of various types are also commonly used on other conventional supports such as zinc, magnesium, paper and plastic.

Although barrier layers greatly enhance the storage stability of plates having an aluminum support and a diazo sensitizer, the above-noted fragility of diazo resin images has tended to limit the press life of both wipe-on and presensitized diazo resin plates. In the case of wipe-on plates, the techniques of application, exposure, and development all require some expertise, and inconsistent results may be obtained if the appropriate technique is not carefully and meticulously followed.

SUMMARY OF THE INVENTION

Among the several objects of the present invention, therefore, may be mentioned the provision of a diazo sensitized lithographic plate exhibiting good storage stability; the provision of such a lithographic plate which is readily processed to provide a planographic printing plate, and in particular the provision of a diazo sensitized lithographic plate which may be exposed and developed by entirely subtractive techniques to provide a planographic printing plate of high durability.

Further objects of the invention include the provision of a base plate adapted for use in preparing both wipe-on and presensitized diazo resin lithographic plates; the provision of such a base plate adapted for sensitization with a diazo resin to provide an entirely subtractive negative-working plate; the provision of a base plate which can be sensitized with either a water-soluble or solvent-soluble diazo resin to provide either a wipe-on or presensitized lithographic plate capable of development to form a planographic printing plate having high durability and a long press life; the provision of a base plate from which wipe-on plates can be readily prepared with consistently satisfactory results; and the provision of a method for preparing such a base plate and a sensitized lithographic plate. Other objects and features will be in part apparent and in part pointed out hereinafter.

Briefly, therefore, the present invention is directed to a base plate adapted to be coated with a light-sensitive diazo resin. The base plate comprises a substrate comprising a metal support and having a water-wettable, hydrophilic surface. Over the substrate and in direct contact with its water-wettable surface is a layer comprising an oleophilic, ink-receptive, organic resin adapted to receive a light-sensitive coating containing a diazo resin sensitizer. The oleophilic resin layer is permeable to a diazo resin sensitizer so that it may penetrate substantially through said layer to establish sufficient contiguity between the diazo resin and the substrate so that both the light-sensitive coating and the organic resin become anchored to the substrate in the areas of exposure when the light-sensitive coating is exposed to light.

The invention is further directed to a lithographic plate comprising a substrate comprising a metal support and having a water-wettable, hydrophilic surface. Overlying the substrate and in direct contact with the water-wettable surface is an inner reinforcing layer comprising an oleophilic, ink-receptive, organic resin. An outer light-sensitive layer comprising a light-sensitive diazo resin generally overlies the inner layer but is sufficiently contiguous with the substrate by penetration of diazo resin substantially through the inner layer so that both the inner layer and the outer layer become anchored to the substrate in the areas of exposure when the light-sensitive outer layer is exposed to light.

The invention also includes a method for preparing a base plate adapted to be coated with a lithographic light-sensitive coating. In accordance with the method, a substrate comprising a metal support and having a water-wettable, hydrophilic surface is contacted with a latex containing an emulsion-polymerized, nonwater-redispersible, oleophilic organic resin to provide a wet resin coating on the surface of the substrate. The wet coating is dried at a temperature sufficiently low so that coalescence of the oleophilic resin is inhibited and a dry resin layer is formed which remains permeable to a light-sensitive diazo resin. The invention is further directed to such a method wherein a solution containing a diazo resin is applied over the base plate to provide a wet light-sensitive coating and the wet light-sensitive coating is dried to form a sensitized lithographic plate.

DESCRIPTION OF THE PREFERRED EMBODIMENTS

Figure 1:
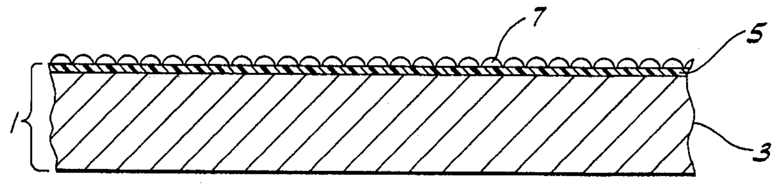
FIG. 1 is a vertical cross-section of a preferred base plate of the invention.

Referring to the drawings, FIG. 1 shows a substrate 1 including a metal support 3 and a barrier layer 5 adapted to prevent reaction between a light-sensitive material and the support. Over barrier layer 5 of substrate 1 is a discontinuous layer 7 of an emulsion-polymerized, non-water-redispersible, oleophilic resin. Layer 7 need not exhibit the extent of discontinuity indicated in FIG. 1 but must be permeable so that a diazo resin can penetrate substantially through it and establish effective contact with substrate 1, as further described hereinbelow.

Figure 2:
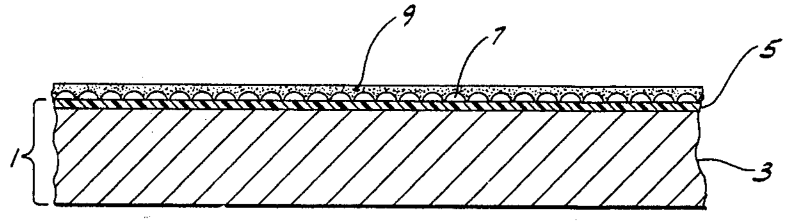
FIG. 2 is a vertical cross-section of a preferred lithographic plate of the invention.

FIG. 2 shows a lithographic plate in which a base plate of the type shown in FIG. 1 has an outer coating of a light-sensitive layer 9 comprising a diazo resin. By penetration substantially through the pores or discontinuities of layer 7, diazo resin of layer 9 effectively contacts barrier layer 5 of substrate 1. The oleophilic resin layer 7 reinforces and cushions the light-sensitive layer and thus imparts strength and durability to the light-sensitive layer and the image produced therefrom. Depending on the minimum film-forming temperature of the oleophilic resin, layer 7 may tend to coalesce as the plate ages, thereby forming a more continuous layer than that depicted in FIG. 2. Coalescence after sensitization is preferred, in fact, since this seals the plate and enhances the adherence of the resin to substrate 1. In a preferred embodiment of the invention, therefore, the sensitized plate is heated to seal it. However, it is essential that the reinforcing layer be initially permeable so that the diazo resin may penetrate substantially through it to establish effective contact with substrate 1.

Preferably, support 3 is constituted of aluminum, in which instance its surface should be grained by conventional mechanical, chemical or electrochemical means. Mechanical graining may be accomplished by the use of any suitable abrading techniques such as, for example, sandblasting, ball graining or brush graining. The surface of the support may be chemically grained by immersion in a mixture of phosphoric and hydrochloric acid, for example a solution containing about 30 parts water, about 7 parts 85% phosphoric acid and about 0.03 parts hydrofluoric acid. Various caustic solutions may also be employed, as may dilute hydrofluoric acid alone if the operation is carefully controlled. A convenient method of electrochemical graining is described by Wruck in U.S. Pat. No. 3,072,546. In accordance with this method, two plates to be grained are immersed in a weak hydrochloric acid solution having a strength of about ½° Baume to about 1° Baume, the two plates being disposed in parallel facing relation between about ¾ inch and about 1½ inch apart. An alternating current is then passed between the two opposed surfaces at a voltage between about 5 and about 11 v. and a temperature between about 15° C. and 26° C. for a period of 25–35 minutes. Other useful electrochemical graining methods are described in Herring U.S. Pat. No. 2,687,373 and Adams U.S. Pat. No. 3,073,765.

Preferably, an aluminum support is also anodized. Anodization can be conveniently accomplished in a sulfuric acid solution having a strength between about 10% and 50% by weight using either alternating or direct current. Whichever type of current is used, a current density of 9–25 amp/ft$^2$ may usefully be employed at a temperature in the range of 70°–120° F. Approximately, 1–6 min. is usually required to properly anodize the surface of grained aluminum. Anodizing may also be carried out using almost any other reasonably well dissociated organic or inorganic acid, for example, phosphoric, hydrochloric, oxalic and citric acids, under conditions similar to those stated. The anodized support is washed thoroughly with water to remove the acid electrolyte, and the excess water is removed from the washed anodized sheet, preferably by suitable mechanical means such as, for example, squeegeeing.

The presence of barrier layer 5 is essential in a presensitized plate. In a wipe-on plate the barrier layer is not absolutely essential but is strongly preferred. If the aluminum support is anodized, the aluminum oxide layer obtained from anodization may serve as the barrier layer for the plate. Preferably, however, the support is silicated or coated with other conventional barrier coating materials such as polyacrylic acid. Where a barrier layer is present, its outer surface affords the water-wettable surface of substrate 1.

In addition to aluminum, other conventional metal supports can be used. To provide a lithographic substrate, metal supports such as zinc or magnesium are preferably grained and coated with a barrier layer of the type used for aluminum.

The oleophilic resin which comprises the reinforcing layer is tougher and more resilient than the diazo resin sensitizer. It thus cushions the diazo resin and the image formed therefrom, and protects the image from abrasion and press wear. It is also believed that the oleophilic resin becomes cross-linked to some extent by interaction with diazo resin when the diazo resin is exposed to light. In any case, the image obtained is exceptionally abrasion resistant and has an excellent press life. Because of its high oleophilicity, the resin of the reinforcing layer affords these advantages in durability without adversely affecting ink receptivity.

As noted, the reinforcing layer should be permeable, at least until the light-sensitive layer is applied thereover. In this context, the term "permeable" means that there are paths within the reinforcing layer along which a light-sensitive coating solution may penetrate and carry a portion of the diazo resin down to direct or proximate contact with the surface of the substrate. Sufficiently proximate contact is established if there is sufficient contiguity between the diazo resin and the substrate so that both the inner reinforcing layer and the outer light-sensitive layer become anchored to the substrate in the areas of exposure when the light-sensitive coating is exposed to light. It is considered essential that diazo resin penetrate substantially through the reinforcing layer to avoid undercutting of the image during development of the exposed plate. Thus, for example, the resin layer may be discontinuous in the sense that the resin solids are distributed as discrete particles on the substrate. Alternatively, the resin layer may have coalesced to the extent of forming a film which is integral but still sufficiently porous to allow the requisite degree of penetration.

Permeability in the reinforcing layer is preferably afforded by depositing it from a latex formed in producing the oleophilic resin by emulsion polymerization. In this way, the resin is deposited from an aqueous vehicle in noncoalesced form.

As further noted above, the reinforcing layer should remain permeable at least until the light-sensitive layer is applied thereover. Preferably, therefore, the resin used for the reinforcing layer has a minimum film-forming temperature which is high relative to temperatures to which the base plate may be exposed for extended times prior to sensitization. A relatively high minimum film-forming temperature is especially important where the base plate is shipped, stored and used in the preparation of a wipe-on plate at a time relatively long after application of the reinforcing layer. In particularly preferred embodiments of the invention, the resin utilized for the reinforcing layer has a minimum film-forming temperature in the range of between about 8° C. and about 75° C. for a presensitized plate and between about 38° C. and about 75° C. for a base plate provided for use in preparing a wipe-on plate.

Although the resin comprising the reinforcing layer is preferably emulsion-polymerized and deposited from a latex, it must be sufficiently oleophilic so as to be nonwater-redispersible. "Nonwater-redispersible" means that once the resin has been deposited from a latex on a substrate and the water vehicle of the latex removed by evaporation, the deposited resin is not redispersed by contact with water. Nonwater-redispersibility prevents removal of the discontinuous layer during deposition of the light-sensitive layer from an aqueous solution. Additionally, it insures that the image which includes this resin is sufficiently ink-receptive and water-repellent so as to assure sharp image resolution.

Essentially, any emulsion polymerized resin having the requisite oleophilicity, nonwater-redispersibility, and resistance to rapid continuous film formation can be used for the permeable resin layer of the base plate of the invention. Thus, for example, a variety of acrylic resins, polyvinyl chloride, vinyl chloride/acrylic copolymers, polyvinyl butyral, polystyrene, styrene/-butadiene copolymers, vinyl acetate/acrylic copolymers, and styrene/acrylic copolymers have been found suitable for this purpose. Among the sources of the reinforcing resin which can be used may be noted the latex containing zinc cross-linked acrylic resins sold under the trade designation "Rhoplex B-336", the latex containing a modified acrylic metal cross-linked polymer sold under the trade designation "Rhoplex B-832", the latex containing a zinc cross-linked polymer sold under the trade designation "Rhoplex B-654", and the latex containing a zinc cross-linked modified acrylic copolymer sold under the trade designation "Rhophex B-453" all by the Rohm and Haas Company; the acrylic latexes sold under the trade designations "Hycar 2600 X 138", "Hycar 2600 X 148" and "Hycar 266 X 172" by B. F. Goodrich Company, the polystyrene latexes sold under the trade designations "Lytron 604" and "Lytron 615" by Monsanto Company, the styrene/butadiene latex sold under the trade designation "Pliolite SBR" by Goodyear Rubber Company; the vinyl acetate/acrylic latex sold under the trade designation "Gelva 925" by Monsanto Company; and the styrene/acrylic copolymer sold under the trade designation "Lytron 110" by Monsanto Company.

As noted, the resin constituting the permeable layer of the base plate of the invention and the inner layer of the lithographic plate preferably has a minimum film-forming temperature on the order of 8° C. or higher, for presensitized plates and 35° C. or higher for wipe-on plates but lower film-forming temperatures are satisfactory if coalescence is not too rapid. In a preferred embodiment of the invention in which a presensitized lithographic plate is sealed by heating after sensitization, excessively high film-forming temperatures are undesirable because sealing then may require exposure to temperatures detrimental to the diazo resin. For this reason, it is preferred that the minimum film-forming temperatures not exceed about 75° C.

The film-forming temperature of an organic resin is in the same range as the glass transition and coalescence temperatures, which are often reported instead of the minimum film-forming temperature by the resin manufacturer. The pertinent transition temperatures of several of the above-listed resins are set forth in Table I.

TABLE I

| | | |
|---|---|---|
| Rhoplex B-336 | 50° C. | MFT* |
| Rhoplex B-832 | 70° C. | MFT* |
| Rhoplex B-453 | 50°-55° C. | MFT* |
| Hycar 2600 × 138 | 25° C. | GTT** |
| Lytron 604 | 104.5° C. | CT*** |

*Minimum film-forming temp.
**Glass transition temp.
***Coalescence temp.

Nonwater redispersible oleophilic resins deposited from latex coating formulations have generally been found to adhere quite adequately to hydrophilic substrates, even prior to exposure of the lithographic plate of the invention to light. Prior to exposure, however, the oleophilic resin and diazo resin may be removed with organic developing solvents while upon exposure the oleophilic and diazo resins become anchored to the substrate and resistant to developing solvents.

Adhesion of the permeable resin layer to the support is enhanced if the resin layer includes a minor proportion of an adhesive polymer such as polyvinyl acetate. The presence of such an adhesive polymer does not prevent development but improves the wear and handling characteristics of the unexposed plate. In a particularly preferred embodiment of the invention, the oleophilic resin layer includes about 28% by weight polyvinyl acetate. Other water-soluble or dispersible resins such as polyacrylamide, polyvinyl alcohol and polyethylene oxide may also be incorporated in the reinforcing layer in proportions similar to those appropriate for polyvinyl acetate.

Commercial polyvinyl acetate polymers suitable for inclusion in the oleophilic resin layer include those sold under the trade designations "Gelva S-98" and "Gelva S-51" by Monsanto Company. In contrast to the resins comprising the principal constituent of the oleophilic layer, these polyvinyl acetate resins are water redispersible. Polyvinyl acetate may tend to form a least a quasi film but its water dispersibility allows penetration of an aqueous diazo resin sensitizing solution substantially through the oleophilic resin layer. In fact, the presence of a water redispersible polyvinyl acetate polymer in the oleophilic layer may actually be helpful in promoting penetration of the aqueous diazo resin solution.

In accordance with the method of the invention, a substrate is provided which preferably comprises a grained, anodized aluminum support provided with a barrier layer as described above. A wet resin coating is provided over the support by contacting the substrate with a latex comprising an emulsion-polymerized non-water-redispersible oleophilic organic resin.

Various conventional pigment formulations compatible with the organic resin can be included in the latex if desired. The presence of a pigment in resin layer 7 contributes to an attractive appearance and renders the image obtained from a sensitized plate readily visible upon development.

The latex may be applied to the substrate by any conventional technique such as, for example, roller coating, dip coating, whirl coating, spray coating, or simply wiping the emulsion onto the substrate surface. Solids contents of commercially available latexes typically range from 30–60% by weight. For application by roller coating, the latex is preferably diluted with water to a solids content on the order of 20% by weight, while in the case of whirl coating dilution to the range of 3% by weight solids is preferred.

After the wet resin coating has been applied over the support, the coating is dried to form a dry oleophilic resin layer. In order to assure that the resin layer is discontinuous or porous, drying is preferably carried out at a temperature below the minimum film-forming temperature of the resin.

The thickness of the oleophilic resin coating is not critical but should not be so great as to impede penetration of the subsequently applied diazo resin substantially through the reinforcing layer to establish effective contact with the surface of the substrate. In the case of roller coating, a minimum of 1 and a maximum of about 10 coats is desirable depending on the solids concentration, roller size and roller hardness.

After the oleophilic resin layer is dry, a light-sensitive coating formulation, preferably a solution of diazo resin, is applied thereover. Because of the cost, safety and pollution problems associated with the use of organic solvents, it is strongly preferred that the diazo resin be water-soluble. A suitable water-soluble diazo sensitizer is described in U.S. Pat. No. 2,714,066 consists of 4-diazo-1,1'-diphenylamine condensed with paraformaldehyde in sulfuric acid, and precipitated as the zinc chloride salt. Other water-soluble diazo sensitizers, including other condensation products of aryl diazo compounds and carbonyl compounds may alternatively be used. The strength of an aqueous diazo resin solution may vary widely, for example from 2–50% by weight, but the preferred strength for use in preparing presensitized plates is in the range of between about 2% and about 10% by weight. For wipe-ons the preferred strength is in the range of between about 3% and about 5% by weight.

After the diazo solution has been applied to the base plate, the wet light-sensitive coating layer is dried to provide a sensitized lithographic plate. Any suitable drying technique and temperature can be utilized since penetration of the reinforcing layer is assued if the latter layer remains permeable until application of the wet light-sensitive coating. As indicated above, no adverse effect is suffered if congealing of the reinforcing layer takes place during the course of drying the light-sensitive coating, and in a preferred embodiment of the invention the sensitized plate is deliberately heated to congeal the oleophilic resin and effectively seal the plate. Thus the adherence of the light-sensitive coating is enhanced and any susceptibility to stripping of this coating from the base plate is substantially reduced.

The lithographic plate of the invention may be exposed to actinic light through a photographic negative and developed to provide a sharp definitive image. When the plate is exposed to light through a negative, the light-struck areas of the diazo resin sensitizer are hardened and rendered insoluble in the developing solution. Although we do not wish to be held to a particular theory, it is believed that when struck by light, the diazo resin also interacts with and crosslinks the oleophilic resin of the reinforcing layer to render this resin also resistant to the developing solution in the exposed areas of the plate. In any event, provided that diazo resin penetrates into and substantially through the reinforcing layer to establish sufficient contiguity between the light-sensitive layer and the substrate, both the light-sensitive layer and the reinforcing layer become anchored to the substrate in the exposed areas, and neither layer is removed in the course of development.

As a result of the strength imparted to the image by the reinforcing layer the development process may be entirely subtractive. No add-on developer is required. Where a water-soluble diazo resin is used, relatively simple water/polar solvent mixtures provide highly satisfactory development. Very rapid development is afforded by use of such water/polar organic solvent mixtures. After development, the plate is washed with water, squeegeed for removal of water, and gummed in a conventional manner.

As noted above, the permeable character of the reinforcing resin coating affords paths along which the subsequently applied diazo resin coating can penetrate substantially through the reinforcing layer to establish effective contact with the substrate. Thus, good "feet" are provided for adhesion of the light-sensitive and oleophilic resin coatings to the substrate in the areas where the light-sensitive coating is subsequently exposed to light. This adhesion, together with the strength afforded by the reinforcing layer imparts durability to the plate with resultant long press life characteristics. The presensitized version of the lithographic plate of the invention has also been found to exhibit good storage characteristics as evidenced by accelerated storage tests at elevated temperature and humidity.

The opportunity to use aqueous vehicles for application of both the oleophilic resin layer and the light-sensitive diazo resin layer represents a major advantage for both the plate manufacturer and the printer. The avoidance of solvents in plate preparation obviates the safety and pollution problems which may otherwise result from the emission of such solvents into the air during handling and drying of the coating formulations. The costs incurred as a result of solvent losses or solvent recovery operations are also avoided. This is a particularly significant advantage during periods of rapidly rising costs and limited availability of the raw materials from which organic solvents are obtained.

The base plate of the invention is highly suited for use in the preparation of either wipe-on or presensitized plates. The plate is uniquely advantageous as a wipe-on substrate since fresh diazo resin may be applied to it to provide subtractive plates of consistently high quality which may be exposed and developed to yield printing plates of long press life and sharp image definition. On the other hand, the good storage stability and press life characteristics of the presensitized plate of the invention render it highly competitive also.

The following examples illustrate the invention.

EXAMPLE 1

A coating formulation was prepared comprising an acrylic resin latex having a minimum film-forming temperature (MFT) of 50° C. sold under the trade designation "Rhoplex B-336" by Rohm and Haas Company (100 ml), an 80% solution of dihexyl sodium sulfosuccinate sold under the trade designation "Aerosol MA" by American Cyanamid Company (1 drop), a pigment dispersion sold under the trade designation "Imperse Red-D" (X-2456) by Hercules, Inc. (15 g), and water in an amount sufficient to provide a total formulation volume of 200 ml. A lithographic base plate was prepared by roller coating this formulation onto a brush-grained silicated aluminum support. Three coatings of the formulation were applied to the support with the resin coating being dried at room temperature after each pass.

The base plate was divided into two portions and one portion of the base plate was immediately sensitized by roller coating an aqueous diazo resin solution thereover. The water-soluble diazo resin used in this example and in all subsequent examples except example 27 and 36 (solvent-soluble resin) was prepared by condensing p-diazodiphenylamine and formaldehyde in sulfuric acid and precipitating the condensation product as the zinc chloride double salt. The conditions of condensation, precipitation and recovery were substantially as described in U.S. Pat. No. 2,714,066.

Two passes of the roller coater were made in applying the diazo resin coating to the base plate, with the second pass being made before the coating applied by the first pass was dried. After the second pass, the coating was dried at room temperature, a contact negative was placed over the sensitized plate and the plate exposed through the negative to ultraviolet light. After exposure, the plate was developed with a water/polar solvent mixture to provide a sharp ink-receptive image.

The second portion of the base plate was stored prior to sensitization in an oven maintained at 54° C. and 75% relative humidity for 3 days, after which it was sensitized, exposed through a negative and developed as described above. An ink-receptive image again resulted.

EXAMPLE 2

A coating formulation containing "Rhoplex B-336" (80 ml), "Imperse Red-D (X2456)" (15 g.) and water sufficient to provide a total formulation volume of 200 ml was prepared and applied to a brush-grained silicated aluminum support in the manner described in Example 1. Four coatings of the formulation were applied to the substrate. The resulting base plate was carried in the trunk of a car for 21 months, after which it was sensitized, and the sensitized plate exposed and developed, in the manner described in Example 1. A sharp ink-receptive image was obtained.

EXAMPLE 3

An emulsion coating formulation was prepared containing "Rhoplex B-336" (80 ml), a polyvinyl acetate emulsion sold under the trade designation "Gelva S-98" by Monsanto Company (20 ml), "Imperse Red-D" (20 ml), and sufficient water to give a total formulation volume of 200 ml. A lithographic base plate was prepared by applying 3 coatings of this formulation to a silicated aluminum support using a roller coater. In order to wet out the support surface, the support was passed through a roller coater containing water before each pass through the emulsion roller coater. The resin coating was dried at room temperature after each pass.

One portion of this base plate was immediately sensitized with diazo formaldehyde resin and exposed in the manner described in Example 1. The plate was then developed with a water/polar solvent mixture. A good ink-receptive image was obtained.

The second portion of the base plate was stored in an oven at 54° C. and 75% relative humidity for 66 hrs. After removal from storage, the base plate was sensitized, exposed, and developed in the manner described in Example 1 yielding a good reproduction.

EXAMPLE 4

Using the emulsion coating formulation described in Example 3, a base plate was prepared by roller coating a brush-grained silicated aluminum support. Two passes were made through the roller coater containing the emulsion coating formulation with each pass being proceeded by a pass through a roller coater containing water. The dried resin coated plate was sensitized by application of an aqueous diazo formaldehyde resin solution. The light-sensitive solution was applied by two passes through a roller coater. The sensitized plate was exposed through a negative to actinic light for 2½ min. and developed with a mixture of a polar solvent and water. The developed plate was treated with a preservative sold under the trade designation "A.G.E." by Western Litho Plate & Supply Co., and the planographic printing plate so prepared was then subjected to a press life test on a 0.004 in. overpacked press, i.e., a press wherein the clearance between drums was reduced about 0.004 in. below standard, thus greatly increasing the pressure and abrasion sustained by the plate in printing. Overpacking by 0.004 in. generally increases the rate of plate wear by a factor of about four. Ten thousand impressions were made with the plate on the overpacked press, upon completion of which good copies were still being obtained.

EXAMPLE 5

Using the coating technique described in Example 3, a brush-grained silicated aluminum support was coated with an emulsion containing an acrylic resin having an MFT of 70° C. sold under the trade designation "Rhoplex B-832" by the Rohm and Haas Company (80 ml), "Gelva S-98" polyvinyl acetate emulsion (20 ml), "Imperse Red-D" (20 ml) and sufficient water to provide a total volume of 200 ml. The resultant base plate was sensitized in the manner described in Example 1 and a portion of the plate thereafter exposed and developed using a developing solution containing 5% by weight cyclohexanone and 95% by weight of an acidic mixture comprising butyrolactone and water. A good image was obtained.

A second portion of the base plate was subjected to accelerated aging by storing it in an oven at 54° C. and 75% relative humidity for 66 hours. The aged portion of the plate was then coated with an aqueous diazo resin solution and the resultant wipe-on plate exposed and developed to form a planographic printing plate having a satisfactory image.

EXAMPLE 6

Using the emulsion coating formulation described in Example 5, a base plate was prepared by roller coating a brush-grained silicated aluminum support. Two passes through the emulsion coating formulation were made, each pass being preceded by a pass through a roller coater containing water. After drying, the resin-coated plate was sensitized with an aqueous diazo formaldehyde resin solution via two passes through a roller coater. The sensitized plate was exposed through a negative to actinic light for $2\frac{1}{2}$ min. and developed with a developing solution consisting of 90% by volume of an acidic mixture comprising butyrolactone and water and 10% by volume cyclohexanone. The developed planographic plate was treated with "A.G.E." preservative and then subjected to a press life test on a 0.004 inch overpacked press. After 10,000 impressions the plate still gave good copies.

EXAMPLE 7

Using the method described in Example 1, a base plate was prepared by coating a brush-grained silicated aluminum support with an emulsion coating formulation containing "Rhoplex B-336" (80 ml), a vinyl chloride latex emulsion sold under the trade designation "Geon 151" by B. F. Goodrich Company (20 ml), "Imperse Red-D" (20 ml), and water sufficient to provide a total volume of 200 ml. A portion of the base plate was sensitized via two passes through a roller coater containing an aqueous solution of diazo resin. The sensitized plate was exposed and developed with a developing solution consisting of 90% by volume of an acidic mixture comprising butyrolactone and water and 10% by volume cyclohexanone. A useful ink-receptive image was obtained.

A second portion of the base plate was subjected to accelerated storage in an oven of 54° C. and 75% relative humidity for three days. The aged plate was sensitized, exposed and developed to give an oleophilic reproduction of the original negative.

EXAMPLE 8

Using the coating technique described in Example 3, a base plate was prepared by coating a brush-grained silicated aluminum support with a formulation containing an acrylic latex emulsion (MFT-73° C.) sold under the trade designation "Rhoplex B-924" by the Rohm and Haas Company (70 ml), an acrylic latex emulsion (MFT-37° C.) sold under the trade designation "Rhoplex AC 73" by Rohm and Haas Company (30 ml), "Imperse Red-D" (20 ml) and sufficient water to provide a total volume of 200 ml. A portion of the base plate thus prepared was sensitized with an aqueous diazo resin solution, exposed and developed using a developing solution consisting of 95% by volume of an acidic mixture comprising butyrolactone and water and 5% by volume of cyclohexanone. A good ink-receptive image was obtained.

A second portion of the base plate was subjected to accelerated storage in an oven at 54° C. and 75% relative humidity for 71 hours. The aged plate was then coated with an aqueous diazo resin solution and successfully exposed and developed to provide a useful image.

EXAMPLE 9

Using the coating technique described in Example 3, a base plate was prepared by coating a brush-grained silicated aluminum support with a coating formulation containing an acrylic latex emulsion (MFT-65° C.) sold under the trade designation "Rhoplex B-505" by the Rohm and Haas Company (70 ml), "Rhoplex AC-73" (30 ml), "Imperse Red-D" (20 ml) and sufficient water to provide a total volume of 200 ml. The base plate thus produced was sensitized by two passes through a roller coater containing an aqueous solution of diazo resin and the sensitized plate was exposed and developed with an acidic developing solution comprising butyrolactone and water. A useful image was obtained.

EXAMPLE 10

A lithographic base plate was prepared by coating a brush-grained silicated aluminum support with a formulation containing a vinyl latex having a glass transition temperature (GTT) of 85° C. sold under the trade designation "Geon 151" by B. F. Goodrich (200 ml), an acrylic emulsion sold under the trade designation "Rhoplex AC-73" by the Rohm and Haas Company (120 ml), "Gelva S-98" polyvinyl acetate emulsion (200 ml), "Imperse Red-D" (100 ml) and a volume of water sufficient to provide a total formulation volume of one liter. The coating formulation was applied to the base plate using a roller coater. The plate was subjected to two passes through the roller coater containing the emulsion, each pass being preceded by a pass through a roller coater containing water. The polymer coating was dried at room temperature after each pass. The base plate thus produced was sensitized with an aqueous solution of diazo resin in the manner described in Example 1 after which the sensitized plate was exposed and developed with a developing solution comprising an acidic mixture of butyrolactone and water. A good image was obtained.

EXAMPLE 11

A lithographic base plate was prepared by roller application of two coatings of the emulsion formulation described in Example 3 to a direct current flash anodized aluminum support. A lithographic plate prepared by sensitizing this base plate with diazo formaldehyde resin was exposed in the manner described in Example 1 and developed with a developing solution consisting of 90% by volume of an acidic mixture comprising butyrolactone and water, and 10% by volume cyclohexanone to provide a useful image. A second plate prepared in accordance with this example was force-aged for one day at 50° C. and 75% relative humidity. When sensitized, exposed and developed, the force-aged plate also afforded a useful image.

EXAMPLE 12

A direct current flash anodized aluminum support was subjected to a single pass through a roller coater containing an emulsion consisting of "Rhoplex B-832" (56 ml), "Rhoplex AC-73" (24 ml), "Gelva S-98" (20 ml), and water sufficient to provide a total formulation volume of 200 ml. Subsequently, two passes were made through a roller coater containing an emulsion consisting of "Rhoplex B-832" (280 ml), "Rhoplex AC-73" (120 ml), "Gelva S-98" (100 ml), "Imperse Red-D" (100 ml), and water sufficient to provide a total formulation volume of 1 l. Each of the latter two passes through the roller coater was preceded by a pass through a roller coater containing water. One base plate prepared in accordance with this example was directly sensitized, exposed and developed as described in Example 1, while a second base plate so-prepared was stored for 23 hours at 54° C. and 75% relative humidity prior to sensitization, exposure and developed in the aforesaid manner. Both plates were developed with a developing solution consisting of 95% by volume of an acidic mixture comprising butyrolactone and water, and 5% by volume cyclohexanone. Good oleophilic ink-receptive images were obtained on both the fresh and stored plates.

EXAMPLE 13

Using the method described in Example 3, a lithographic base plate was prepared by coating a brush-grained silicated aluminum support with a formulation consisting of an acrylic latex (MFT-50 to 55° C.) sold under the trade designation "Rhoplex B-453" by Rohm and Haas Company (56 ml), "Rhoplex AC-73" (24 ml), "Gelva S-98" (20 ml), "Imperse Red-D" (20 ml), and water sufficient to give a total formulation volume of 200 ml. The base plate so prepared was sensitized and exposed in the manner described in Example 1 and developed with a developing solution consisting of 90% by volume of an acidic mixture comprising butyrolactone and water, and 10% by volume cyclohexanone to provide an oleophilic ink-receptive image.

EXAMPLE 14

A lithographic base plate was prepared by subjecting a brush-grained silicated aluminum support to four passes through a roller coater containing an emulsion formulation consisting of "Rhoplex B-654" (40 ml), "Rhoplex B-832" (40 ml), "Gelva S-98" (20 ml), "Imperse Red-D" (20 ml), and water sufficient to give a total formulation volume of 200 ml. Each pass through the roller coater containing the emulsion formulation was preceded by a pass through a roller coater containing water, and the polymer coating was dried at room temperature after each pass. The resulting base plate was sensitized by coating it with an aqueous diazo resin solution. The sensitized plate was exposed in the manner described in Example 1, and developed using a developing solution consisting of 95% by volume of an acidic mixture comprising butyrolactone and water, and 5% by volume cyclohexanone. The plate developed readily to give an oleophilic ink-receptive image.

EXAMPLE 15

A lithographic base plate was prepared by coating a brush-grained silicated aluminum support with an emulsion formulation consisting of "Rhoplex B-654" (65 ml), "Rhoplex AC-73" (15 ml), "Gelva S-98" (20 ml), "Imperse Red-D" (20 ml), and a sufficient volume of water to give a total formulation volume of 200 ml. The coating was applied by two passes through a roller coater, each pass being preceded by a pass through a roller coater containing water. The base plate so produced was divided into two portions and one portion was immediately sensitized via two passes through a roller coater containing an aqueous diazo resin solution. The sensitized plate was exposed through a negative to actinic light for 2½ min. and developed with a developing solution consisting of 95% by volume of an acidic mixture comprising butyrolactone and water, and 5% by volume cyclohexanone. An attractive planographic printing plate was obtained which was successfully used to obtain 10,000 impressions on a 0.005 in. overpacked press. At the completion of this press test, the plate was still giving excellent reproductions and was clearly capable of producing further good impressions.

The second portion of the base plate was stored in an oven at 54° C. and 75% relative humidity for 45 hours and then sensitized via two passes through a roller coater containing an aqueous diazo resin solution. The lithographic plate portion so obtained was exposed to actinic light through a photographic negative transparency for 2½ min. and developed with a developing solution consisting of 95% by volume of an acidic mixture comprising butyrolactone and water, and 5% by volume cyclohexanone. An attractive plate resulted, although the image appeared to be slightly weak on one edge.

EXAMPLE 16

An emulsion formulation was prepared by blending an acrylic latex (MFT-52° C.) sold under the trade designation "Rhoplex B-83" by Rohm and Haas Company (80 ml), "Gelva S-98" (20 ml), "Imperse Red-D" (20 ml), and a sufficient volume of deionized water to provide a total formulation volume of 200 ml. Using the method described in Example 15, this emulsion was used to prepare a lithographic base plate by coating it onto a brush-grained and silicated aluminum support. A second base plate was afforded by coating the same formulation in the same fashion onto an alternating current anodized silicated support. Both of the base plates of this example were sensitized via two passes through a roller coater containing an aqueous solution of diazo resin and the sensitized plates were exposed through a photographic negative to actinic light and developed with a developing solution consisting of 85% by volume of an acidic mixture of butyrolactone and water, and 15% by volume cyclohexanone. Sharp-imaged, attractive planographic plates were obtained.

EXAMPLE 17

A lithographic base plate was prepared by coating a brush-grained silicated aluminum support with an emulsion coating formulation containing an acrylic latex sold under the trade designation "Rhoplex B-924" by Rohm and Haas Company (500 ml), "Imperse Red-D" (175 ml), and sufficient deionized water to provide a total emulsion volume of 1 l. The formulation was applied to the support by 2 passes through a roller coater as described in Example 15, and a base plate so produced was sensitized via 2 passes through a roller coater containing an aqueous solution of diazo resin. The sensitized plate was exposed to actinic light through a photographic negative for 2½ min. and developed with a developing solution consisting of 95% by volume of an acidic mixture comprising butyrolactone, water and ethyl alcohol, and 5% by volume cyclohexanone. The developed plate was treated with "A.G.E." to provide a planographic plate which was run on a 0.005 in. overpacked press for 15,800 impressions. At the completion of the press run, the plate was still providing good copies.

EXAMPLE 18

Both a brush-grained, silicated aluminum support and an anodized brush-grained silicated aluminum support were coated with an emulsion formulation as described in Example 17. Each of these plates was force-aged for 41 hrs. in an oven at 54° C. and the plates were then sensitized via 2 passes through a roller coater containing an aqueous solution of diazo resin. The sensitized plates were exposed to actinic light through a photographic negative transparency and developed to give good ink-receptive images.

EXAMPLE 19

An emulsion coating formulation was prepared from "Rhoplex B-83" (200 ml), an acrylic latex (MFT 90° C. sold under the trade designation "Rhoplex B-85" by Rhom and Haas Company (200 ml), "Gelva S-98" (100 ml), a naphthol red dark pigment dispersion sold under the trade designation "Harshaw's SL-3081S" by Harshaw Chemical Company, and water sufficient to provide a total formulation volume of 1 l. Using the method described in Example 15, a brush-grained, silicated aluminum support was coated with the formulation of this example and the resulting base plate was sensitized by application of an aqueous diazo resin solution from a sponge. The sensitized plate was exposed to actinic light through a negative and developed with a developing solution consisting of 90% by volume of an acidic mixture comprising water and butyrolactone, and 10% by volume cyclohexanone. A useful oleophilic image was obtained.

EXAMPLE 20

A coating formulation was prepared from an acrylic latex (GTT-20° C.) sold under the trade designation "Hycar 2600 X 138" (80 ml), a pigment dispersion sold under the trade designation "Super Blue G" by Hercules, Inc. (32 ml), and water sufficient to provide a total formulation volume of 200 ml. A brush grained silicated aluminum support was coated via 3 passes through a roller coater containing the formulation of this example, with each pass through the emulsion roller coater being preceded by a pass through a roller coater containing deionized water and each pass through the formulation coater being succeeded by drying of the coating at room temperature. The polymer-coated lithographic base plate obtained was sensitized via 2 passes through a roller coater containing an aqueous solution of diazo resin. The plate was dried and then exposed to a carbon arc light source through a contact negative for 2½ min. and developed with a developing solution consisting of 95% by volume of an acidic mixture comprising butyrolactone and water, and 5% by volume cyclohexanone. An ink-receptive image was obtained that was an excellent reproduction of the negative.

EXAMPLE 21

A lithographic base plate was prepared in a manner described in Example 20, except that an acrylic latex (GTT-40° C.) sold by B. F. Goodrich Company under the trade designation of "Hycar 2600 X 148"was used in place of "Hycar 2600 X 138". The base plate was sensitized, and the sensitized plate exposed and developed in the manner described in Example 20 to again provide an ink-receptive image that was an excellent reproduction of the negative.

EXAMPLE 22

A lithographic base plate was prepared in the manner described in Example 20, except that the coating formulation contained an acrylic latex (GTT-33° C.) sold by B. F. Goodrich Company under the trade designation "Hycar 2600 X 172" instead of "Hycar 2600 X 138". The base plate so prepared was sensitized, and the sensitized plate exposed and developed in the manner described in Example 20 to again provide an ink-receptive image that was an excellent reproduction of the negative. The developed planographic plate of this example exhibited a pigment stain on one small portion of the nonimage area.

EXAMPLE 23

Using the method described in Example 20, a brush-grained silicated aluminum support was roller coated with a coating formulation containing a vinyl chloride acrylic copolymer dispersion (GTT-53° C.) sold under the trade designation "Geon 460 X 9" by B. F. Goodrich Company (80 ml) and water sufficient to provide a total volume of 200 ml. The base plate so produced was sensitized, and the sensitized plate exposed and developed in the manner described in Example 20 to provide a clean planographic plate having an ink-receptive image.

EXAMPLE 24

Using the method described in Example 20, a brush-grained silicated aluminum support was coated with an emulsion formulation containing an acrylic latex (MFT-29° C.) sold under the trade designation "Rhoplex AC-201" by Rohm and Haas Company (80 ml), "Super Blue G" pigment disperson (32 ml), and water sufficient to provide a total formulation volume of 200 ml. The base plate so produced was sensitized, and the sensitized plate exposed in the manner described in Example 25 and developed with a developing solution comprising an acidic mixture containing water and butyrolactone. A clean planographic plate was obtained having an ink-receptive image.

EXAMPLE 25

A brush-grained alternating current anodized silicated aluminum support was passed through a roller coater containing deionized water, and immediately thereafter passed through a roller coater containing an emulsion coating formulation containing a polystyrene emulsion having a coalescene temperature (CT) of 104.5° C. sold under the trade designation "Lytron 604" by Monsanto Company (100 ml) and deionized water (100 ml). Upon emergence from the roller coater, the coating was dried at room temperature. The polymer coating step was repeated 5 times and the resulting lithographic base plate was sensitized via 2 passes through a roller coater containing an aqueous solution of diazo resin. The sensitized plate was exposed in the manner described in Example 20 and developed with a developing solution sold under the trade designation "Tri-Solv Regular" by Western Litho Plate & Supply Co. to provide a planographic printing plate having an oleophilic, ink-receptive image that was a good reproduction of the negative. The nonimage areas were clean.

EXAMPLE 26

Using the method described in Example 20, a brush-grained alternating current anodized, silicated aluminum support was coated with a formulation comprised of a polystyrene latex sold under the trade designation "Lytron 604" by Monsanto Company (82 ml), "Imperse Red-D" (20 ml), and an amount of water sufficient to provide a total formulation volume of 200 ml. The dried base plate was sensitized, and the sensitized plate exposed in the manner described in Example 20. The exposed plate was developed with a developing solution sold under the trade designation "Tri-Solv Regular" by Western Litho Plate & Supply Co. to provide a highly oleophilic and ink-receptive image.

EXAMPLE 27

A solvent-soluble diazo resin was prepared by condensing a water-soluble 4-diazodiphenylamine formaldehyde resin with p-toluenesulfonic acid. In preparing the solvent-soluble resin, the water-soluble resin (9.0 g) was initially dissolved in deionized water (300 ml). To the resulting aqueous solution, stirred at room temperature, was added a solution containing p-toluenesulfonic acid (9.0 g) and deionized water (100 ml). The resulting reaction mixture was stirred at room temperature for several minutes and then allowed to stand in the dark for 1.5 hrs. The supernatant water was decanted away from the sticky reaction product, and the residual material dissolved by stirring it into ethylene glycol monomethyl ether (400 ml).

The solution of solvent-soluble diazo resin in ethylene glycol monomethyl ether was charged to a roller coater and a lithographic base plate of the type described in Example 26 was coated with this solution in a single pass through the roller coater. The sensitized plate was dried at room temperature, exposed to actinic light through a contact negative, developed with "Tri-Solv Regular", treated with "Super A.G.E.", and dried. A highly oleophilic ink-receptive image resulted and the nonimage areas were clean.

EXAMPLE 28

Using the method described in Example 25, a brush-grained silicated aluminum support was coated with an emulsion formulation containing a polystyrene dispersion sold under the trade designation "Lytron 615" by Monsanto Company (100 ml), deionized water (90 ml) and "Imperse Red-D" (20 ml). The base plate so produced was sensitized and exposed in the manner described in Example 25 and developed with a developing solution consisting of 50 parts by volume ≡Tri-Solv Mild" and 50 parts by volume "Tri-Solv Regular". Development was followed by treatment of the image with "Super A.G.E." A highly oleophilic ink-receptive image was obtained and the nonimage areas were clean.

EXAMPLE 29

Using the method described in Example 20, a brush-grained silicated aluminum support was coated with an emulsion formulation containing an acrylic latex (MFT-8° C.) sold under the trade designation "Rhoplex AC-33" by Rohm and Haas Company (80 ml), "Imperse Red-D" (20 ml), and a sufficient amount of water to provide a total emulsion volume of 200 ml. The base plate so produced was split into four portions. One portion was immediately sensitized with diazo resin in the manner described in Example 20, and the sensitized plate was exposed to actinic light through a contact negative, and developed with a developing solution consisting of 95% by volume of an acidic mixture comprising butyrolactone and water, and 5% by volume cyclohexanone. A good ink-receptive image was obtained. Thereafter, an unsensitized portion of the plate was stored for 5 hrs. at room temperature (about 73° F.), after which the plate was sensitized, and the sensitized plate exposed and developed as described above. An ink-receptive image resulted, indicating that 5 hrs. after coating, film coalescence had not proceeded to a degree sufficient to exclude penetration of a diazo resin through the reinforcing acrylic resin layer in the course of the sensitization step. A still further portion of the base plate was stored at room temperature for 3 days, after which the plate was sensitized, and the sensitized plate exposed and developed as described in Example 20. A good reproduction of the negative resulted in the center of the exposed portion of the plate, but the image on one edge was badly broken up, indicating that film coalescence had proceeded to such an extent that inadequate penetration of the diazo resin was realized. The plate background, however, proved to be clean. A final portion of the unsensitized base plate was placed in a freezer at −11° C. immediately after coating. This portion was stored at −11° C. for 1 mo. This base plate was then permitted to warm to room temperature, after which it was sensitized, and the sensitized plate exposed, developed and treated with "Super A.G.E.". Good reproduction of the negative was obtained except on one outer edge of the plate where the coating was abnormally thick as compared to the rest of the plate. The image did not hold on this outer edge (approximately ⅛ in.) of the plate. The image was ink-receptive and the background clear.

EXAMPLE 30

Using the method described in Example 20, a brush-grained silicated aluminum support was coated with an emulsion formulation consisting of an acrylic latex (MFT-17° C.) sold under the trade designation "Rhoplex HA-12" by Rohm and Haas Company (80 ml), "Imperse Red-D" (20 ml), and a sufficient amount of water to provide a total formulation volume of 200 ml. A portion of the lithographic base plate so produced was immediately sensitized in the manner described in Example 20, and the sensitized plate was dried, exposed to a carbon arc light source through a contact negative for 2½ min., and developed with an acidic mixture comprising butyrolactone and water. The image obtained was ink-receptive and constituted an excellent reproduction of the negative. There was no sign of image breakdown anywhere on the plate.

Another portion of the unsensitized base plate was stored for 3 days at room temperature and then sensitized, and the sensitized plate was exposed and developed in the manner described above. An ink-receptive image was obtained. This image was a good reproduction of the negative except at the outer edge of the plate (about ¼ in.).

The third portion of the unsensitized base plate was immediately placed in a freezer at −11° C. and stored for 25 days. The plate was then permitted to warm to room temperature and sensitized. The sensitized plate was exposed, and developed to give an excellent reproduction of the negative. The 3% halftone dots were excellent and the image was ink-receptive.

EXAMPLE 31

Using the method described in Example 20, a brush-grained, silicated aluminum plate was coated with an emulsion formulation comprising a styrene/butadiene rubber latex sold under the trade designation "Pliolite SBR (LPR 4738C)" by Goodyear Rubber Company (80 ml), "Imperse Red-D" (20 ml), and a sufficient amount of deionized water to provide a total formulation volume of 200 ml. After the formulation had dried, the plate was sensitized in the manner described in Example 20, the sensitized plate exposed to a carbon arc light source through a contact negative for 2½ min., and developed with "Tri-Solv Regular" to provide an ink-receptive image. The nonimage areas were badly pigment stained but, on inking the plate with an ink rag, the pigment stain was removed, yielding a clean plate.

The image obtained was an excellent reproduction of the negative, except at the outer edge of the plate (about ¼-½ in.) where the image broke up to some extent. The polymeric coating at the edge where the image broke up was substantially thicker than in most other areas of the plate.

EXAMPLE 32

Using the method described in Example 20, a brush-grained, silicated aluminum support was coated with an emulsion formulation consisting of a vinyl acetate/acrylic latex sold under the trade designation "Gelva 925" by Monsanto Company (80 ml), "Imperse Red-D" (23 ml), and a sufficient amount of water to provide a total formulation volume of 200 ml. The polymer-coated plate was trimmed with a cutter to remove the outer edges where the polymeric coating was abnormally thick. Immediately thereafter, the plate was sensitized in the manner described in Example 20, and the sensitized plate was dried, exposed to ultraviolet light through a contact negative, and developed with a developing solution comprising an acidic mixture of butyrolactone and water. An excellent reproduction of the negative was obtained and the image, after treatment with "Super A.G.E.", was ink-receptive.

EXAMPLE 33

Using the method described in Example 20, a brush-grained silicated aluminum support was coated with an emulsion coating formulation consisting of a styrene/acrylate emulsion (CT-<5° C.) sold under the trade designation "Lytron 110" by Monsanto Company (80 ml), "Imperse Red-D" (20 ml), and a sufficient amount of deionized water to provide a total formulation volume 200 ml. The base plate so produced was sensitized in the manner described in Example 20. The sensitized plate was dried, exposed to ultraviolet light through a contact negative, and developed with a developing solution consisting of 90% by volume of an acidic mixture comprising butyrolactone and water, and 10% by volume cyclohexanone. An excellent ink-receptive image resulted. The image broke down in the outer ¼ in. margin of the plate where the polymeric coating was abnormally thick.

EXAMPLE 34

A coating formulation was prepared consisting of an acrylic latex (MFT-8° C.) sold under the trade designation "Rhoplex B-60A" by Rohm and Haas Company (102 ml), "Imperse Red-D" (21 ml), and a sufficient amount of water to provide a total formulation volume of 200 ml. This formulation was charged to a roller coater and applied to a brush-grained silicated aluminum support. In applying the formulation to the substrate, a total of 6 passes were made through the roller coater and the wet coating was dried after the 2d, 4th and 6th passes.

The base plate of this example was divided into 2 portions. The first portion was immediately sensitized in the manner described in Example 25, and the sensitized plate exposed to ultraviolet light through a contact negative, and developed with a developing solution consisting of 95% by volume of an acidic mixture comprising butyrolactone and water, and 5% by volume cyclohexanone. A strong ink-receptive image resulted.

The second portion of the base plate was stored at room temperature for about 25 hrs. and then sensitized, and the sensitized plate exposed and developed in the manner described above. The image on the second portion of the base plate did not hold well, indicating that after 25 hrs. of storage at room temperature coalescence had proceeded to such an extent that the diazo resin could not penetrate the reinforcing film to a sufficient extent to provide a firmly bound image.

EXAMPLE 35

A coating formulation was prepared by thoroughly mixing "Rhoplex AC-73" (400 ml), "Imperse Red-D" (X-2456) (125 ml), and deionized water in an amount sufficient to provide a total formulation volume of 1 liter. A brush-grained anodized, silicated aluminum support was coated with this emulsion via two passes through a roller coater. Each of the two passes through the roller coater containing the coating emulsion was preceded by a pass through a roller coater containing deionized water to wet out the surface on which the emulsion coating was to be applied. Following each pass through the roller coater containing the coating emulsion, the wet coating was dried at room temperature. The resulting polymer coated plate was rinsed with water via a single pass through a roller coater containing deionized water and then redried to provide a lithographic base plate.

The lithographic base plate was sensitized using an aqueous solution of diazo resin applied via two passes (with no intermediate drying steps) through a roller coater. The sensitized plate was then dried at room temperature and cut into three portions. The first portion of the sensitized plate was exposed through a contact negative and then developed with an aqueous acidic solution containing butyrolactone and cyclohexanone. An excellent reproduction of the negative resulted and the oleophilic image was ink-receptive.

The second portion of the sensitized plate was stored for 47 hours in an oven at 54° C. and 75% relative hummdity. The stored plate was exposed and developed in the manner described above to provide an excellent ink-receptive reproduction of the negative.

The third portion of the sensitized plate was stored for 6 months in an air-conditioned room. This stored plate was exposed and developed in the manner described above. The plate developed rapidly to give a good reproduction of the negative. There was no difference in the speed of this aged plate and the freshly prepared plate of portion one.

EXAMPLE 36

A base plate was prepared in the manner described in Example 35 and sensitized with an ethylene glycol monomethyl ether solution of the solvent-soluble diazo whose preparation is described in Example 27. The base plate was subjected to 2 passes through a roller coater containing the diazo resin solution, and the coated plate fan-dried at room temperature. The sensitized plate was then exposed to actinic light through a contact negative, developed with a developing solution consisting of 92.5% by volume of an acidic mixture comprising butyrolactone and water, and 7.5% by volume cyclohexanone, and treated with "Super A.G.E." to provide an excellent ink-receptive image.

Another base plate prepared in the manner described in Example 35 was sensitized with an aqueous solution of a water-soluble diazo resin in the manner described in Example 20 and then dried. The sensitized plate was then subjected to 2 passes through a roller coater containing the ethylene glycol monomethyl ether solution of a solvent-soluble diazo prepared in the manner described in Example 27 and the wet coated plate was dried under a fan. This plate was then exposed to actinic light through a contact negative, developed with a developing solution of 92.5% by volume of an acidic mixture comprising butyrolactone and water, and 7.5% by volume cyclohexanone, and treated with "Super A.G.E." to provide a good ink-receptive image.

EXAMPLE 37

An emulsion coating formulation was prepared by thoroughly mixing "Rhoplex AC-73" (400 ml), "Imperse Red-D" (200 ml) and water in an amount sufficient to provide a total formulation volume of 1 liter. This formulation was coated onto a brush-grained silicated aluminum support using the coating procedure described in Example 35. The resulting base plate was then sensitized and dried in the manner described in Example 35, and the sensitized plate cut into two protions.

One portion of the sensitized plate was immediately exposed through a contact negative and developed with an aqueous acidic solution containing butyrolactone and cyclohexanone. An oleophilic image was obtained which was a good reproduction of the negative.

The second portion of the sensitized plate was stored for 47 hours in an oven at 54° C. and 75% relative humidity. This stored plate was exposed and developed as described above to give a good reproduction of the contact negative.

In view of the above, it will be seen that the several objects of the invention are achieved and other advantageous results attained.

As various changes could be made in the above methods and products without departing from the scope of the invention, it is intended that all matter contained in the above description or shown in the accompanying drawings shall be interpreted as illustrative and not in a limiting sense.

What is claimed is:

1. A base plate adapted to be coated with a light-sensitive diazo resin comprising a substrate comprising a metal support and a barrier layer having a water-wettable, hydrophilic surface over said support, and over said substrate and in direct contact with said surface on oleophilic layer comprising an oleophilic ink-receptive organic resin adapted to receive a light-sensitive coating comprising a water-soluble diazo resin sensitizer and permeable to said sensitizer so that it may penetrate substantially through said layer to establish sufficient contiguity between said diazo resin and said substrate so that both said light-sensitive coating and said organic resin layer become anchored to said substrate in the areas of exposure when said light-sensitive coating is exposed to light.

2. A base plate as set forth in claim 1 wherein said organic resin is an emulsion-polymerized, nonwater-redispersible resin.

3. A base plate as set forth in claim 2 wherein said organic resin has a minimum film-forming temperature of between about 8° C. and about 75° C.

4. A base plate as set forth in claim 3 wherein said organic resin has a minimum film-forming temperature of between about 35° C. and about 75° C.

5. A base plate as set forth in claim 2 wherein said organic resin is an acrylic resin.

6. A base plate as set forth in claim 1 wherein said metal support is aluminum.

7. A base plate as set forth in claim 6 wherein said aluminum support is anodized.

8. A base plate as set forth in claim 7 wherein said substrate further comprises a silicate layer overlying said support, the outer surface of said silicate layer affording the water-wettable surface of said substrate.

9. A base plate as set forth in claim 8 wherein said aluminum support is grained.

* * * * *